United States Patent
Bird et al.

(10) Patent No.: US 7,170,321 B2
(45) Date of Patent: Jan. 30, 2007

(54) GATE DRIVE CIRCUIT WITH NEGATIVE OFFSET

(75) Inventors: Ross W. Bird, Canton, PA (US); William C. Knoll, Turbotville, PA (US); John M. Staron, Montoursville, PA (US)

(73) Assignee: QorTek, Inc., Williamsport, PA (US)

( * ) Notice: Subject to any disclaimer, the term of this patent is extended or adjusted under 35 U.S.C. 154(b) by 43 days.

(21) Appl. No.: 11/212,259

(22) Filed: Aug. 26, 2005

(65) Prior Publication Data

US 2006/0044046 A1 Mar. 2, 2006

Related U.S. Application Data

(60) Provisional application No. 60/605,472, filed on Aug. 27, 2004.

(51) Int. Cl.
*H03B 1/00* (2006.01)
(52) U.S. Cl. ..................... 327/108; 327/379
(58) Field of Classification Search ............. 327/108, 327/110, 374, 376, 377, 379, 380, 381
See application file for complete search history.

(56) References Cited

U.S. PATENT DOCUMENTS

| 5,418,709 | A | | 5/1995 | Lukemire |
| 5,889,387 | A | | 3/1999 | Massie |
| 6,094,087 | A | * | 7/2000 | He et al. ................. 327/434 |
| 6,104,248 | A | | 8/2000 | Carver |
| 6,456,511 | B1 | | 9/2002 | Wong |
| 6,614,288 | B1 | * | 9/2003 | Dagan et al. ............. 327/365 |
| 6,668,060 | B1 | | 12/2003 | Boudreaux, Jr. |

* cited by examiner

*Primary Examiner*—Jeffrey Zweizig
(74) *Attorney, Agent, or Firm*—Michael Crilly, Esq.

(57) ABSTRACT

A gate drive circuit capable of providing both positive and negative drive from a DC power supply is presented. The circuit includes an isolator stage, a driver stage, an optional tuning stage, an offset stage, a shaping stage, and a switching stage, each electrically coupled in the order described. The isolator stage provides electrical isolation from signal level circuitry. The driver stage boosts the power within the signal from the isolator stage. The tuning stage slows rising and falling edges along the signal from driver. The offset stage shifts the unipolar gate drive signal from the tuning stage into the negative voltage range. The shaping stage modifies the signal from the offset stage so as to ensure squared transitions. The switching stage enables voltage control. The described circuit is applicable to electronics utilizing a variety of voltage controlled switching devices.

15 Claims, 4 Drawing Sheets

Ch2 Max
7.61 mV

Ch2 Min
-23.6 mV

Ch1 26.0 V  Ch2 10.00mVΩ    M 1.00µs  A Ch1  0.20V
                            T 4.216000µs

Ch2 Max
2.60 mV

Ch2 Min
-4.05 mV

Ch1 26.00 V  Ch2 10.00mVΩ    M 200ns  A Ch1  8.80V
                             T 5.16000µs

GATE DRIVE CIRCUIT WITH NEGATIVE OFFSET

CROSS REFERENCE TO RELATED APPLICATIONS

This application is based upon and claims priority under 35 U.S.C. § 119(e) from U.S. Provisional Application No. 60/605,472 filed Aug. 27, 2004, entitled Gate Drive Circuit with Negative Offset, the contents of which are hereby incorporated in its entirety by reference thereto.

FEDERALLY SPONSORED RESEARCH AND DEVELOPMENT

None.

BACKGROUND OF THE INVENTION

1. Field of the Invention

The present invention generally relates to a circuit enabling positive and negative drive from a DC power supply.

2. Description of the Related Art

A conventional integrated circuit driver generates a waveform having a voltage range from ground to some positive value, typically 12 to 15 volts. However, many applications require a voltage waveform having both negative and positive values.

Therefore, what is required is a simple and efficient gate drive circuit capable of offsetting a DC voltage waveform.

Furthermore, what is required is a simple and efficient gate drive circuit that minimizes transients and noise associated with the offset of a positive DC voltage waveform.

SUMMARY OF INVENTION

An object of the present invention is to provide a gate drive circuit that minimizes switching transients, noise, and other inefficiencies during the offset of a positive DC voltage waveform.

The present invention includes an isolator stage, driver stage, optional tuning stage, offset stage, shaping stage, and switching stage, each electrically coupled in the order described. The isolator stage provides electrical isolation from signal level circuitry and allows for high quality low side gate drivers on both high and low side devices. The driver stage boosts power within the signal from the isolator stage so as to enable drive of the switching stage. The tuning stage slows rising and falling edges within the gate drive signal from the driver stage so as to reduce dV/dt related problems. The offset stage shifts the otherwise positive, unipolar gate drive signal from either the driver stage or the tuning stage so as to include negative voltage values. The shaping stage reshapes the signal from the offset stage so as to ensure squared transitions along the signal. The switching device stage allows for voltage control.

The present invention has several advantages. The invention enables tuning of drive circuitry for optimum switching of a variety of switch devices. The invention enables optimization of the drive waveform so as to reduce switching stresses, reduce noise, maximize efficiency, and/or increase speed. The invention has demonstrated efficiency improvements from 5% to 10% at relatively high switching frequencies when operating in a semi-resonant, turn-off configuration.

REFERENCE NUMERALS

| | |
|---|---|
| 1 Isolator stage | D1 Diode |
| 2 Driver stage | D2 Diode |
| 3 Tuning stage | R1 Resistor |
| 4 Offset stage | R2 Resistor |
| 5 Shaping stage | R3 Resistor |
| 6 Switching stage | C1 Capacitor |
| 7 Gate drive circuit | C2 Capacitor |
| 8 Round transition | L1 Inductor |
| 9 Square transition | Q1 Switch |
| 10 Rising edge | U1 First integrated circuit |
| 11 Falling edge | U2 Second integrated circuit |

BRIEF DESCRIPTION OF THE DRAWINGS

FIG. 2b shows an exemplary voltage waveform produced by the driver stage for the waveform shown in FIG. 2a.

DETAILED DESCRIPTION OF THE INVENTION

Figure 1:
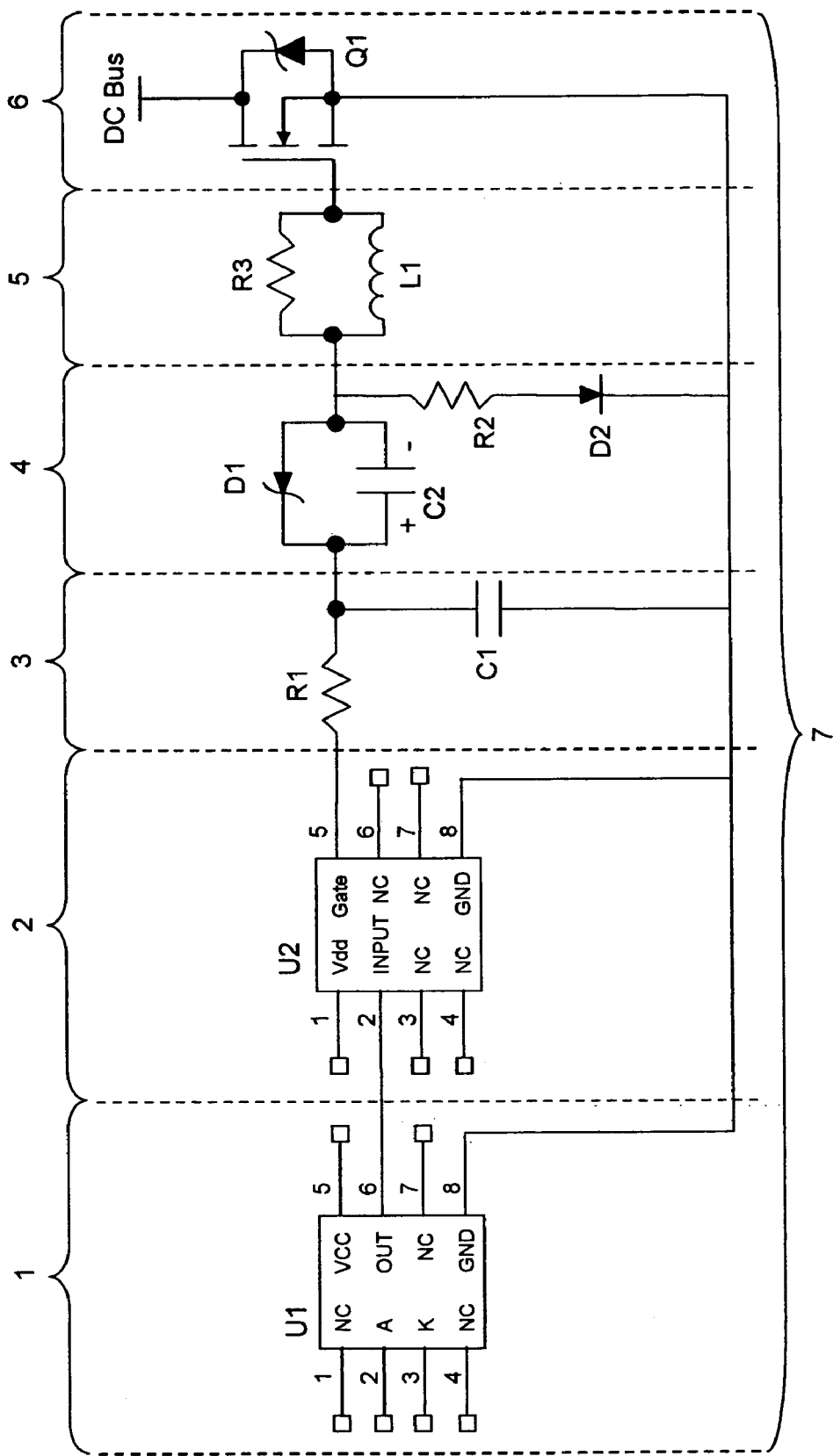
FIG. 1 is a circuit diagram of the present invention showing the gate drive circuit composed of isolator, driver, tuning, offset, shaping, and switching stages.

FIG. 1 describes the present invention, referred to herein as the gate drive circuit 7. FIGS. 2a–2e show exemplary waveforms after each stage of the gate drive circuit 7. FIGS. 3, 4, 5, 6a, and 6b are waveforms from a gate drive circuit 7 representative of switching frequencies in the range of 100 kHz to 200 kHz.

Referring now to FIG. 1, a gate drive circuit 7 is shown including an isolator stage 1, a driver stage 2, an optional tuning stage 3, an offset stage 4, a shaping stage 5, and a switching stage 6, each electrically coupled in the order described. Isolator stage 1, driver stage 3, tuning stage 3, and offset stage 4 are electrically connected to the switching stage 6. The present invention is electrically coupled to a DC power supply.

Figure 2A:
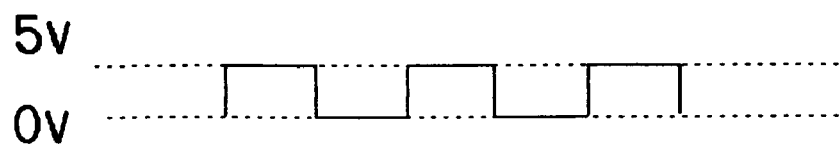
FIG. 2a shows an exemplary voltage waveform produced by the isolator stage.

The isolator stage 1 of the gate drive circuit 7 produces a voltage waveform for communication into the driver stage 2. The isolator stage 1 is shown comprised of a first integrated circuit U1. The first integrated circuit U1 may be a commercially available logic gate, preferably an optocoupled device. The GND pin of the first integrated circuit U1 is electrically coupled to the switch Q1. While a variety of waveforms are possible, FIG. 2a shows a square wave produced by one embodiment of the isolator stage 1.

Figure 2B:
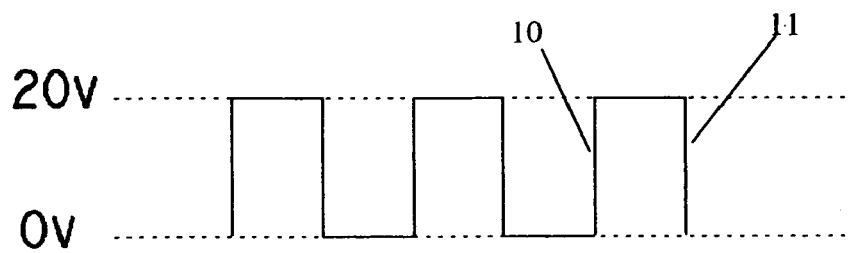

The driver stage 2 of the gate drive circuit 7 boosts power in the voltage waveform so as to produce a gate drive signal having a higher maximum voltage, as represented in FIG. 2b, than that in the waveform from the isolator stage 1. The driver stage 2 is shown comprising a second integrated circuit U2. The second integrated circuit U2 is a commercially available gate driver producing a voltage waveform between ground and a positive value. The INPUT pin of the second integrated circuit U2 is electrically connected to the OUT pin of the first integrated circuit U1. The GND pin is electrically coupled to the electrical connection between the isolator stage 1 and switching stage 6. The output waveform of the driver stage 2 is unipolar and positive.

Figure 2C:
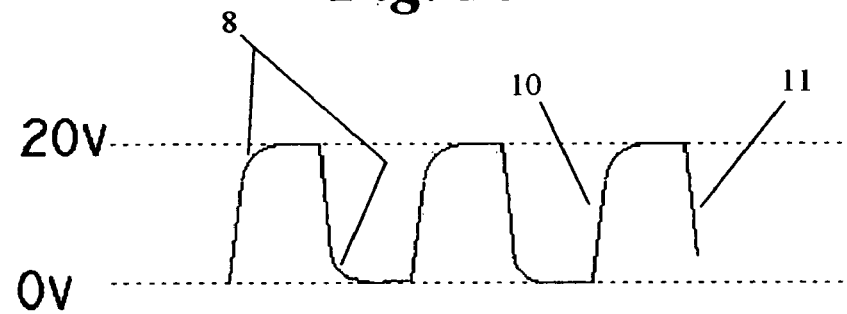
FIG. 2c shows an exemplary voltage waveform produced by the tuning stage for the waveform shown in FIG. 2b.

The tuning stage 3 is an optional circuit between the driver stage 2 and offset stage 4. This stage of the gate drive circuit 7 functions to increase the time differential of rising edges 10 and falling edges 11 along the gate drive signal after the driver stage 2, so as to avoid dV/dt related problems. FIG. 2c shows the waveform from FIG. 2b after modification by one embodiment of the tuning stage 3 so as to include sloped rising edges 10 and falling edges 11.

In preferred embodiments, the tuning stage 3 includes a resistor R1 and a capacitor C1. The resistor R1 is electrically coupled to the GATE pin of the driver stage 2 at one end and to the offset stage 4 at the other end. The capacitor C1 is electrically connected at one end between the resistor R1 and offset stage 4 and at the other end to the electrical coupling between the first integrated circuit U1 and switch Q1.

The offset stage 4 of the gate drive circuit 7 offsets or shifts the gate drive signal so as to reduce maximum positive voltage values and to include negative voltage values. The output from a typical offset stage 4 is a signal that extends from −5V to −8V up to +15V to +20V.

In preferred embodiments, the offset stage 4 includes two diodes D1, D2, a capacitor C2, and a resistor R2. The first diode D1, preferably a Zener diode, and capacitor C2 are electrically coupled in a parallel arrangement between the tuning stage 3 or driver stage 2 and shaping stage 5. One end of the parallel arrangement is coupled to the resistor R1, when a tuning stage 3 is present, or to the GATE pin of the second integrated circuit U2, for embodiments without a tuning stage 3. The second diode D2, preferably a conventional diode, and resistor R2 are electrically coupled in series. Thereafter, the resistor R2 is coupled between the parallel arrangement of diode D1 and capacitor C2 and shaping stage 5. The diode D2 is coupled to the electrical connection between first integrated circuit U1 and switch Q1.

Figure 2D:
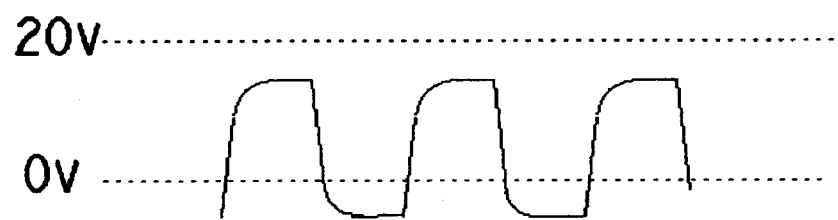
FIG. 2d shows an exemplary voltage waveform produced by the offset stage for the waveform shown in FIG. 2c.

FIG. 2d shows the waveform from FIG. 2c after modification by one embodiment of the offset stage 4. While not intending to be bound by theory, a positive voltage excursion along the gate drive signal causes a current path through the diode D1, resistor R2, and diode D2 so that the capacitor C2 develops a charge having the polarity shown in FIG. 1. The capacitor C2 then holds the described charge to supply the negative voltage excursion. This functionality is repeated to produce a voltage waveform with positive and negative values.

Figure 2E:
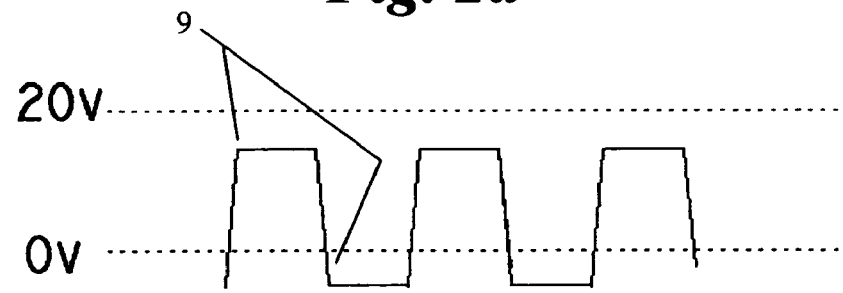
FIG. 2e shows an exemplary voltage waveform produced by the shaping stage for the waveform shown in FIG. 2d.

The shaping stage 5 refines the gate drive signal from the offset stage 4. As represented in FIG. 2c, the tuning stage 3 smoothes the gate drive signal from the driver stage 2 so as to introduce round transitions 8 along the waveform. The shaping stage 5 modifies the gate drive signal, thereby replacing round transitions 8 with square transitions 9, as represented in FIG. 2e.

In preferred embodiments, the shaping stage 5 includes a resistor R3 and an inductor L1. Resistor R3 and inductor L1 are coupled in a parallel configuration which is electrically connected at one end to the switch Q1 in the switching stage 6 and to the parallel arrangement in the offset stage 4. While not intending to be bound by theory, the inductor L1 mimics the use of a current source to drive the gate, whereas the resistor R3 damps ringing of the inductor L1 with the gate capacitance.

The switching circuit 6 is shown including a switch Q1 which is electrically connected to a DC BUS and to the shaping circuit 5. Exemplary switches Q1 include commercially available MOSFETs, IGBTs, JFETs, MESFETs, and other semiconductor type devices.

Figure 3:
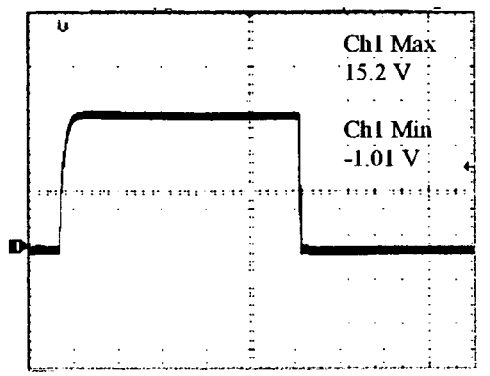
FIG. 3 shows an exemplary gate drive waveform before optimization.
Figure 4:
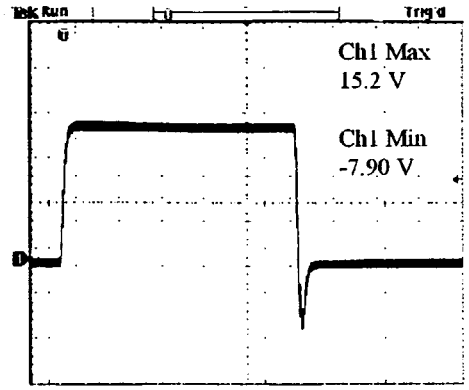
FIG. 4 shows the exemplary gate drive waveform after optimization.

Referring now to FIGS. 3 and 4, a drive waveform is shown before and after optimization, respectively. Before optimization, the drive waveform from the drive circuit is clean with a very fast fall time. After optimization, the waveform has a tuned fall time that continues into the negative voltage region thereby allowing the device to shutoff at a rate determined by the inductor L1. When switched in this fashion, the device is not forced to turn OFF faster than the filter inductor L1 would allow. This functionality removes a number of switching transients that might otherwise be introduced into the circuit, thereby reducing stress on devices within the circuit and removing noise from the output signal.

Figure 5:
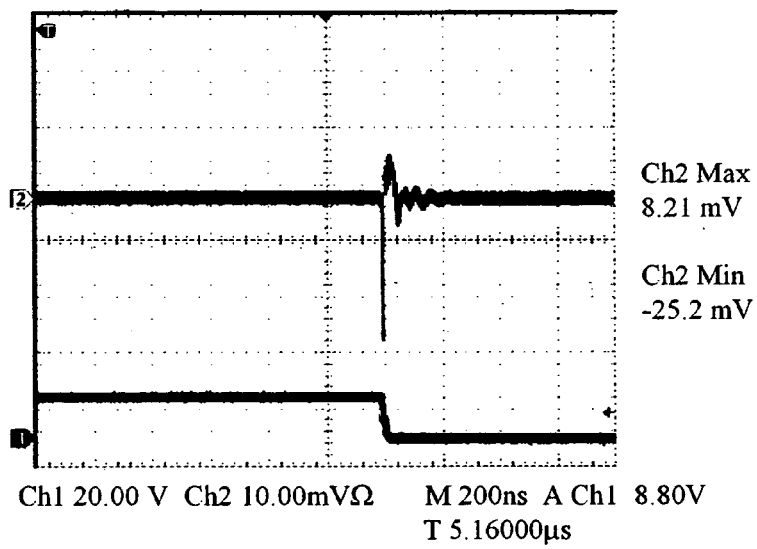
FIG. 5 shows the effect of a drive circuit without optimization on a source current.

Referring now to FIG. 5, the effect of the original fast turn OFF is shown. A large negative current spike is readily apparent at idle and caused by forcing the switch Q1 to turn OFF.

Figure 6A:
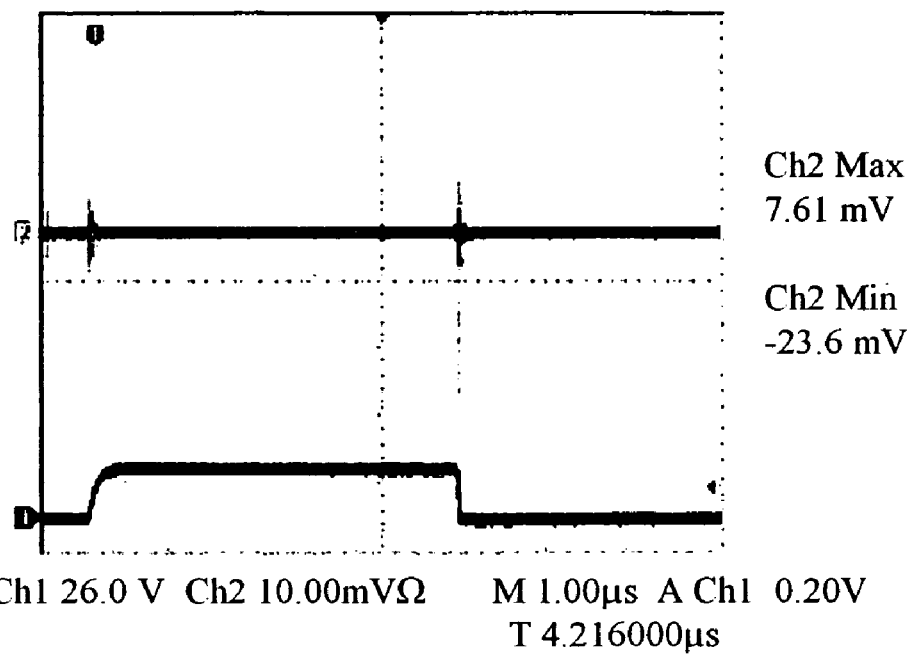
FIG. 6a shows idle current and gate drive signals without optimization.
Figure 6B:
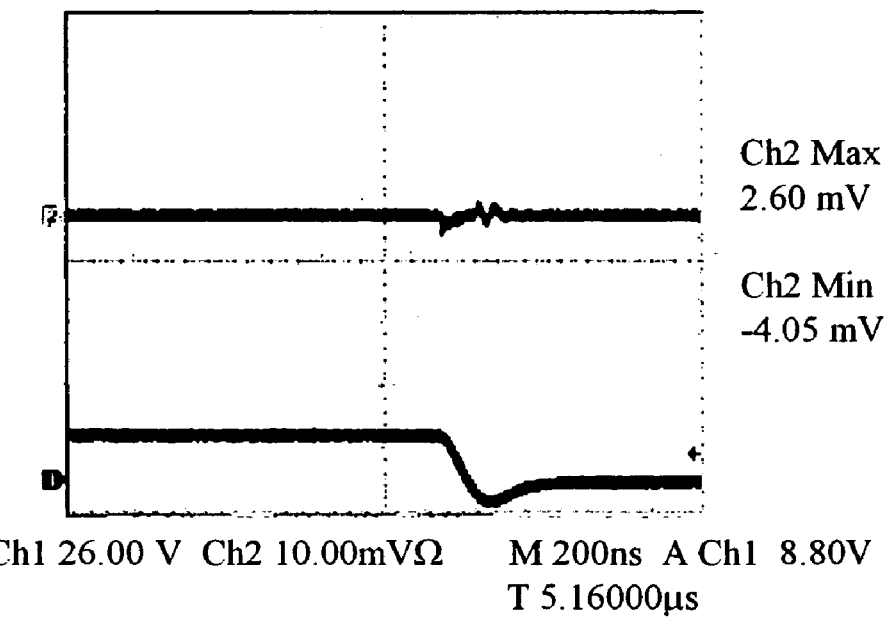
FIG. 6b shows idle current and gate drive signals with optimization.

Referring now to FIGS. 6a and 6b, the original gate drive and optimized drive are shown, respectively. The tuned fall time is expanded to show the effect of the non-optimized turn OFF on the source current as compared to the optimized turn OFF achieved with the present invention.

The present invention shown in FIG. 1 may be fabricated from a variety of commercially available devices. TABLE 1 summarizes exemplary components for one possible embodiment.

TABLE 1

| Component | Manufacturer | Model No. | Description |
| --- | --- | --- | --- |
| Diode (D1) | Diodes, Inc. | ZMM5231B-7 | 5.1 V 500 MW MINIMELF |
| Diode (D2) | Diodes, Inc. | LL4148-13 | 75 V 500 MW MINIMELF |
| Resistor (R1) | Panasonic-ECG | ERJ-8ENF21R5V | 21.5 Ohm 1/8 W 1% 1206 SMD |
| Resistor (R2) | Panasonic-ECG | ERJ-8GEYJ511V | 510 Ohm 1/4 W 5% 1206 SMD |
| Resistor (R3) | Panasonic-ECG | ERJ-8GEYJ510V | 51 Ohm 1/4 W 5% 1206 SMD |
| Capacitor (C1) | Panasonic-ECG | ECJ-2VC1H471J | 470 PF 50 V CERM CHIP 0805 SMD |
| Capacitor (C2) | Panasonic-ECG | ECJ-3YF1E106Z | CERAMIC 10 UF 25 V F TYPE 1206 |
| Inductor (L1) | Panasonic-ECG | ELJ-ND1R0JF | INDUCTOR 1.0 UH 5% FIXED SMD |
| Switch (Q1) | IXYS | IXTA3N120 | HIGH VOLTAGE MOSFET 1200 V 3 A |

TABLE 1-continued

| Component | Manufacturer | Model No. | Description |
|---|---|---|---|
| Integrated circuit (U1) | Agilent | HCPL-0211 | OPTOCOUPLER LOG-OUT 5 MBD |
| Integrated circuit (U2) | Micrel | MIC4452YM TR | IC DRIVER MOSF 12 A LO SIDE |

The description above indicates that a great degree of flexibility is offered in terms of the present invention. Although the present invention has been described in considerable detail with reference to certain preferred versions thereof, other versions are possible. Therefore, the spirit and scope of the appended claims should not be limited to the description of the preferred versions contained herein.

The invention claimed is:

1. A gate drive circuit providing negative offset comprising:
    (a) an isolator stage capable of introducing a voltage waveform with positive values and providing electrical isolation;
    (b) a driver stage electrically coupled to said isolator stage, said driver stage boosting power of said voltage waveform to produce a gate drive signal with positive values;
    (c) an offset stage electrically coupled to said driver stage, said offset stage modifying said gate drive signal to include negative values;
    (d) a shaping stage electrically coupled to said offset stage, said shaping stage modifying said gate drive signal so as to square transitions; and
    (e) a switching stage comprising a voltage controlled device electrically coupled to said shaping stage and said isolator stage, said driver stage and said offset stage electrically coupled between said switching stage and said isolator stage.

2. The gate drive circuit of claim 1, wherein said isolator stage is a logic gate optocoupler.

3. The gate drive circuit of claim 1, wherein said driver stage is a gate driver device.

4. The gate drive circuit of claim 1, wherein said offset stage comprising:
    (i) a zener diode;
    (ii) a capacitor electrically coupled to said zener diode in a parallel arrangement, said parallel arrangement electrically coupled between said driver stage and said shaping stage;
    (iii) a resistor; and
    (iv) a diode electrically coupled to said resistor in a serial arrangement, said resistor electrically coupled at one end between said parallel arrangement and said shaping stage and said diode electrically coupled at one end between said isolator stage and said switching stage.

5. The gate drive circuit of claim 1, wherein said shaping stage comprising:
    (i) a resistor; and
    (ii) an inductor electrically coupled to said resistor in a parallel arrangement.

6. The gate drive circuit of claim 1, wherein said voltage control device is a semiconductor switch.

7. A gate drive circuit providing negative offset comprising:
    (a) an isolator stage capable of introducing a voltage waveform with positive values and providing electrical isolation;
    (b) a driver stage electrically coupled to said isolator stage, said driver stage boosting power of said voltage waveform to produce a gate drive signal with positive values;
    (c) a tuning stage electrically coupled to said driver stage, said tuning stage modifying said gate drive signal so as to slow rising and falling edges along said gate drive signal;
    (d) an offset stage electrically coupled to said tuning stage, said offset stage modifying said gate drive signal to include negative values;
    (e) a shaping stage electrically coupled to said offset stage, said shaping stage modifying said gate drive signal so as to square transitions; and
    (f) a switching stage comprising a voltage controlled device electrically coupled to said shaping stage and said isolator stage, said driver stage, said tuning stage and said offset stage electrically coupled between said switching stage and said isolator stage.

8. The gate drive circuit of claim 7, wherein said tuning stage comprising:
    (i) a resistor electrically coupled between said driver stage and said offset stage; and
    (ii) a capacitor electrically coupled at one end between said resistor and said offset stage and at another end between said switching stage and said isolator stage.

9. The gate drive circuit of claim 7, wherein said isolator stage is a logic gate optocoupler.

10. The gate drive circuit of claim 7, wherein driver stage is a gate driver device.

11. The gate drive circuit of claim 7, wherein said offset stage comprising:
    (i) a zener diode;
    (ii) a capacitor electrically coupled to said zener diode in a parallel arrangement, said parallel arrangement electrically coupled between said tuning stage and said shaping stage;
    (iii) a resistor; and
    (iv) a diode electrically coupled in a serial arrangement, said resistor electrically coupled at one end between said parallel arrangement and said shaping stage and said diode electrically coupled at another end between said isolator stage and said switching stage.

12. The gate drive circuit of claim 7, wherein said shaping stage comprising:
    (i) a resistor; and
    (ii) an inductor electrically coupled to said resistor in a parallel arrangement.

13. The gate drive circuit of claim 7, wherein said voltage control device is a semiconductor switch.

14. A method of providing positive and negative drive from a DC power supply, comprising the steps of:
    (a) introducing a voltage waveform with positive values;
    (b) boosting power of said voltage waveform to produce a gate drive signal;
    (c) offseting said gate drive signal to include negative values;
    (d) shaping said gate drive signal so as to square transitions; and
    (e) communicating said gate drive signal to a voltage controlled device.

15. A method of providing positive and negative drive from a DC power supply, comprising the steps of:

(a) introducing a voltage waveform with positive values;
(b) boosting power of said voltage waveform to produce a gate drive signal;
(c) tuning said gate drive signal so as to slow rising and falling edges;
(d) offseting said gate drive signal to include negative values;
(e) shaping said gate drive signal so as to square transitions; and
(f) communicating said gate drive signal to a voltage controlled device.

* * * * *